United States Patent
Dozier et al.

(10) Patent No.: US 7,840,927 B1
(45) Date of Patent: Nov. 23, 2010

(54) MUTABLE CELLS FOR USE IN INTEGRATED CIRCUITS

(76) Inventors: Harold Wallace Dozier, 6906 McKamy Blvd., Dallas, TX (US) 75248; Steven Craig Eplett, 912 Oranda Ter., Fremont, CA (US) 94536; Pat Y. Hom, 2059 Blue Ridge Dr., Milpitas, CA (US) 95035

( * ) Notice: Subject to any disclaimer, the term of this patent is extended or adjusted under 35 U.S.C. 154(b) by 284 days.

(21) Appl. No.: 11/953,048

(22) Filed: Dec. 8, 2007

Related U.S. Application Data

(60) Provisional application No. 60/869,250, filed on Dec. 8, 2006.

(51) Int. Cl.
G06F 17/50 (2006.01)
G06F 9/45 (2006.01)

(52) U.S. Cl. .................. 716/9; 716/4; 716/5; 716/6; 716/7

(58) Field of Classification Search .......... 716/4, 716/5, 6, 7, 9
See application file for complete search history.

(56) References Cited

U.S. PATENT DOCUMENTS

| | | | |
|---|---|---|---|
| 5,625,575 | A | 4/1997 | Goyal |
| 5,875,117 | A | 2/1999 | Jones |
| 6,085,032 | A | 7/2000 | Scepanovic |
| 6,088,519 | A * | 7/2000 | Koford .................. 716/9 |
| 6,557,153 | B1 | 4/2003 | Dahl |
| 2002/0198695 | A1 | 12/2002 | Sherman |
| 2003/0046050 | A1 | 3/2003 | Padilla |
| 2003/0177459 | A1 * | 9/2003 | Chen .................. 716/5 |
| 2003/0187626 | A1 | 10/2003 | Catto |
| 2004/0181380 | A1 | 9/2004 | Yoshida |
| 2005/0086040 | A1 | 4/2005 | Davis |

(Continued)

FOREIGN PATENT DOCUMENTS

EP 1907957 1/2007

(Continued)

OTHER PUBLICATIONS

U.S. Appl. No. 11/953,048, filed Dec. 8, 2007, Dozier et al.

(Continued)

*Primary Examiner*—Vuthe Siek
*Assistant Examiner*—Magid Y Dimyan
(74) *Attorney, Agent, or Firm*—Schwabe, Williamson & Wyatt, P.C.

(57) ABSTRACT

An integrated circuit implementation methodology uses mutable cells, e.g. cells that are capable of being personalized for use as one of a plurality of resource types. For example, a mutable cell is designed to have a component layout and a set of lower-layer internal connections compatible with both a design of a flip-flop, and a design of a pair of multiplexers. Independent customizations of the mutable cell, using higher layers of interconnect, efficiently use the cell as a flip-flop or as a pair of multiplexers. Use of mutable cells in an integrated circuit advantageously enables a set of predefined lower-layer photomask, such as for a predefined base array, to be efficiently shared among different applications. In some embodiments, a Simultaneous Dynamical Integration (SDI) Electronic Design Automation (EDA) flow advantageously uses mutable cells, such as to balance demand for resources against supply thereof.

18 Claims, 6 Drawing Sheets

U.S. PATENT DOCUMENTS

| | | |
|---|---|---|
| 2007/0150846 A1 | 6/2007 | Furnish |
| 2007/0204252 A1 | 8/2007 | Furnish |

FOREIGN PATENT DOCUMENTS

| | | |
|---|---|---|
| KR | 1020010087374 | 7/2003 |
| KR | 1020040032109 | 11/2005 |
| KR | 1020010033623 | 6/2009 |
| WO | WO2004061725 | 7/2004 |
| WO | WO2007002799 | 1/2007 |
| WO | WO2007146966 | 12/2007 |
| WO | WO2007147084 | 12/2007 |
| WO | WO2007147150 | 12/2007 |
| WO | WO2007149717 | 12/2007 |
| WO | WO2008005622 | 1/2008 |

OTHER PUBLICATIONS

U.S. Appl. No. 11/967,186, filed Dec. 29, 2007, Lebrun.
U.S. Appl. No. 11/967,187, filed Dec. 29, 2007, Furnish.
U.S. Appl. No. 11/967,182, filed Dec. 29, 2007, Furnish.
U.S. Appl. No. 11/967,180, filed Dec. 29, 2007, LeBrun.
U.S. Appl. No. 11/967,183, filed Dec. 29, 2007, LeBrun.
U.S. Appl. No. 11/967,184, filed Dec. 29, 2007, Bose.
U.S. Appl. No. 11/967,185, filed Dec. 29, 2007, Furnish.
U.S. Appl. No. 11/967,179, filed Dec. 29, 2007, Furnish.
U.S. Appl. No. 12/301,456, filed Nov. 18, 2008, Bose.
U.S. Appl. No. 11/427,333, filed Jun. 28, 2006, Furnish.
U.S. Appl. No. 60/696,661, filed Jul. 5, 2005, Furnish.
U.S. Appl. No. 60/694,949, filed Jun. 29, 2005, Furnish.
U.S. Appl. No. 60/804,690, filed Jun. 14, 2006, Furnish.
U.S. Appl. No. 60/697,902, filed Jul. 9, 2005, Furnish.
U.S. Appl. No. 60/747,651, filed Jul. 9, 2005, Furnish.
Non-final Office Action dated Aug. 20, 2008 for U.S. Appl. No. 11/684,522.
Final OA dated Apr. 28, 2009 for U.S. Appl. No. 11/684,522.
Final Office Action dated Jun. 11, 2009 for U.S. Appl. No. 11/744,758.
Alupoaei, Net-Based Force-Directed Macrocell Placement for Wirelength Optimization, IEEE Transactions on Very Large Scale Integration (VLSI) System, vol. 10, No. 6, Dec. 2002.
U.S. Appl. No. 60/803,032, filed May 24, 2006, Bose.
U.S. Appl. No. 60/804,173, filed Jun. 8, 2006, Furnish.
U.S. Appl. No. 60/804,448, filed Jun. 12, 2006, Furnish.
U.S. Appl. No. 60/804,574, filed Jun. 13, 2006, Furnish.
U.S. Appl. No. 60/804,643, filed Jun. 13, 2006, Furnish.
U.S. Appl. No. 60/804,826, filed Jun. 15, 2006, Furnish.
U.S Appl. No. 60/805,086, filed Jun. 18, 2006, Bose.
U.S. Appl. No. 60/869,250, filed Dec. 8, 2006.
Non-final OA dated Nov. 18, 2008 for U.S. Appl. No. 11/744,758.
Final OA dated Jun. 11, 2009 for U.S. Appl. No. 11/744,758.

* cited by examiner

MUTABLE CELLS FOR USE IN INTEGRATED CIRCUITS

CROSS REFERENCE TO RELATED APPLICATIONS

Priority benefit claims for this application are made in the accompanying Application Data Sheet (if any). To the extent permitted by the type of the instant application, this application incorporates by reference for all purposes the following applications, which are all owned by the owner of the instant application:

U.S. Provisional Application Ser. No. 60/869,250, filed Dec. 8, 2006, first named inventor Harold Wallace Dozier, and entitled ALTERABLE CELLS FOR USE IN INTEGRATED CIRCUITS; and PCT Application Serial No. PCT/US07/71406, filed Jun. 15, 2007, first named inventor Geoffrey Furnish, and entitled SIMULTANEOUS DYNAMICAL INTEGRATION APPLIED TO DETAILED PLACEMENT.

BACKGROUND

1. Field

Advancements in integrated circuit design, including placement and routing of elements in a Computer Aided Design (CAD) context, are needed to provide improvements in performance, efficiency, and utility of use.

2. Related Art

Unless expressly identified as being publicly or well known, mention herein of techniques and concepts, including for context, definitions, or comparison purposes, should not be construed as an admission that such techniques and concepts are previously publicly known or otherwise part of the prior art. All references cited herein (if any), including patents, patent applications, and publications, are hereby incorporated by reference in their entireties, whether specifically incorporated or not, for all purposes. Nothing herein is to be construed as an admission that any of the references are pertinent prior art, nor does it constitute any admission as to the contents or date of actual publication of these documents.

Synopsis

The invention may be implemented in numerous ways, including as a process, an article of manufacture, an apparatus, a system, a composition of matter, and a computer readable medium such as a computer readable storage medium or a computer network wherein program instructions are sent over optical or electronic communication links. In this specification, these implementations, or any other form that the invention may take, may be referred to as techniques. The Detailed Description provides an exposition of one or more embodiments of the invention that enable improvements in performance, efficiency, and utility of use in the field identified above. The Detailed Description includes an Introduction to facilitate the more rapid understanding of the remainder of the Detailed Description. The Introduction includes Example Embodiments of one or more of systems, methods, articles of manufacture, and computer readable media in accordance with the concepts described herein. As is discussed in more detail in the Conclusions, the invention encompasses all possible modifications and variations within the scope of the issued claims.

DETAILED DESCRIPTION

Figure 1:
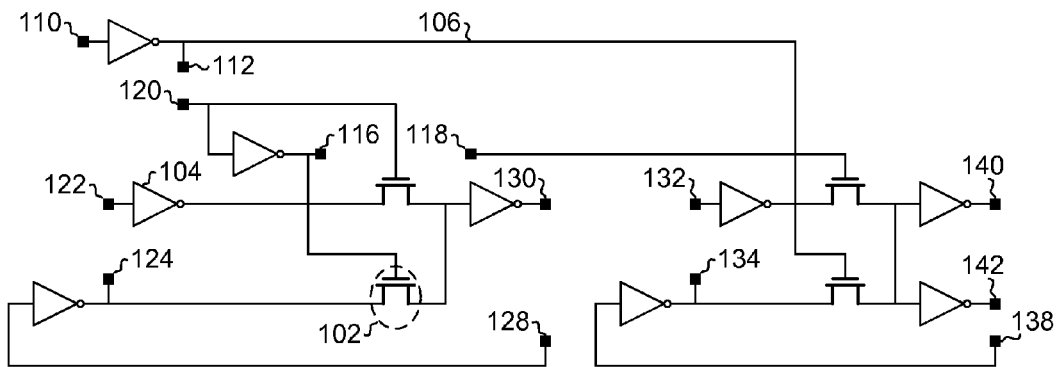
FIG. 1 illustrates selected details of an embodiment of a mutable cell.

A detailed description of one or more embodiments of the invention is provided below along with accompanying figures illustrating selected details of the invention. The invention is described in connection with the embodiments. It is well established that it is neither necessary, practical, or possible to exhaustively describe every embodiment of the invention. Thus the embodiments herein are understood to be merely exemplary, the invention is expressly not limited to or by any or all of the embodiments herein, and the invention encompasses numerous alternatives, modifications and equivalents. To avoid monotony in the exposition, a variety of word labels (including but not limited to: first, last, certain, various, further, other, particular, select, some, and notable) may be applied to separate sets of embodiments; as used herein such labels are expressly not meant to convey quality, or any form of preference or prejudice, but merely to conveniently distinguish among the separate sets. The order of some operations of disclosed processes is alterable within the scope of the invention. Wherever multiple embodiments serve to describe variations in process, method, and/or program instruction features, other embodiments are contemplated that in accordance with a predetermined or a dynamically determined criterion perform static and/or dynamic selection of one of a plurality of modes of operation corresponding respectively to a plurality of the multiple embodiments. Numerous specific details are set forth in the following description to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Introduction

This introduction is included only to facilitate the more rapid understanding of the Detailed Description; the invention is not limited to the concepts presented in the introduction (including explicit examples, if any), as the paragraphs of any introduction are necessarily an abridged view of the entire subject and are not meant to be an exhaustive or restrictive description. For example, the introduction that follows provides overview information limited by space and organization to only certain embodiments. There are many other embodiments, including those to which claims will ultimately be drawn, discussed throughout the balance of the specification.

There are multiple methodologies for implementing digital logic elements in Application Specific Integrated Circuits (ASICs). One well known methodology is a gate array, where a plurality of generic transistors are interconnected as needed to create specific types of logic elements at specific locations in the Integrated Circuit (IC); these logic elements having combinational logic functions such as NAND gates, NOR gates, XOR gates, and multiplexers, or having sequential logic functions such as latches and flip-flops. A gate array ASIC is only unique in a wiring interconnect pattern of IC design and/or manufacturing flow. The wiring interconnect pattern formation begins with a contact photomask and proceeds through higher interconnect layers such as metal 1, via 1, metal 2, via 2, and so on, up to the final (highest) photomask of the IC manufacturing process. Design of photomasks used prior to the wiring interconnect pattern formation (such as used to form transistors) is common to all ASICs implemented from a same base gate array.

Another well known methodology for ASIC implementation is a standard cell methodology. In a standard cell ASIC, each standard cell includes a unique design of interconnected components, such as transistors, and forms a specific logic element. The standard cells are then placed on the IC and interconnected as needed to implement an application. The standard cell methodology offers density and performance advantages over the gate array methodology because a size and a location of each transistor is optionally optimized for a specific logic element it is used in. Unlike the gate array methodology, the standard cell methodology generally requires that all photomasks in the IC process are unique for each particular ASIC. Hence, a standard cell implementation generally has more steps and is more expensive in non-recurring production costs than a gate array implementation because more unique photomasks are designed and fabricated.

In some applications, it is expedient to use a variant methodology wherein a predefined collection of cells, such as standard cells, is initially arrayed on an IC and connected to power and/or to ground, but there is not yet any logic interconnection between the cells. At this stage, the IC is still generic. Different applications are implementable on such a predefined-cell IC by using different logic interconnections ("personalizations") between the predefined cells. Optionally, lower layer photomasks, such as the contact and metal 1 (and possibly some higher layer) photomasks are also a part of a generic set of photomasks, with all application specific interconnections between cells occurring in photomask layers above metal 1 (or possibly some higher layer). The variant methodology offers some efficiency advantages over the gate array methodology, but in some usage scenarios is not as efficient in some metrics as the standard cell methodology. The inefficiency relative to the standard cell methodology is because a choice of logic elements in a particular small region of the IC is limited to only a set of cells that are already defined in that region. Furthermore, if one of the predefined cell types is not required in a particular small region of the IC, the predefined cell type is not replaceable by an alternative cell type that is usable in that region of the IC.

The inefficiencies of using a collection of predefined cells are mitigated if some of the predefined cells are altered in function from application to application without changing the predefined transistors of the predefined cells, as any changes to the transistors would negate the ability to share the lower layer photomasks between different applications. Furthermore, it is desirable that any such alteration occur without changing lower layer photomasks, such as the contact and metal 1 photomasks. Accordingly, a need exists for a methodology to allow cells to be altered without changing the transistors of the cells, and optionally without changing the lower layer photomasks that define the cells.

As described herein, "dynamic time-evolving SDI" refers to SDI techniques for the modeling and simulation of elements for integrated circuit placement and routing. Dynamic time-evolving SDI includes applying principles of Newtonian mechanics to an "analogy-system" based on a netlist that is a specification of the integrated circuit as part of an Electronic Design Automation (EDA) flow (such as during physical design development of the integrated circuit). In some usage scenarios, the analogy-system (often referred to simply as "system") includes a single point particle corresponding to each device in the netlist. The system further includes a set of one or more forces acting on each of the particles computed, in certain embodiments, as a weighted sum. Various numerical integration techniques are used to apply Newton's second law of motion to the system, forming a time-evolving representation of the system in state-space. In other words, a simulation determines paths of the particles in a plane (or three dimensions). Then resultant locations of the point particles are mapped back into resultant placements of the corresponding devices, thus providing SDI-directed placements.

Using dynamic time-evolving SDI, elements of the system are pushed simultaneously forward in time through a smooth integration where the model for the system dynamics is an abstraction using continuous variables and simultaneous exploration. Departures from idealizations of continuous variables and simultaneity are artifacts of techniques for solving the system of coupled simultaneous governing equations, such as that occur with numerical integration on a digital computer. In such digital computer implementations, the departures are limited to specifiable tolerances determined by the quality of result goals and economic considerations (such as available solution time, supply of computing power available, and other similar constraints).

The system forces include attractive and spreading components, used to model effects of interconnect, resource usage (such as device area), and to drive various optimizations (such as timing closure). Some of the system forces are directly expressed as functions of the positions of other devices (such as attractive forces between connected devices), some of the forces are indirect functions of the positions of other devices and are computed by way of various fields (such as one or more density fields), and some of the forces that act on some of the devices are independent of the positions of the other devices in the system. Computing selected forces as fields, in certain embodiments, affords more computational efficiency.

SDI-directed placement is useful in various integrated circuit design flows and related implementation architectures, including full custom, semi-custom, standard cell, structured array, and gate array design flows and related implementation architectures. Several variations in the context of structured array design flows enable efficient processing of numerous constraints imposed by the partially predetermined nature of the arrays. A library of composite cells or "morphable-devices" is provided to a synthesis tool (such as Synopsys Design Compiler or any other similar tool). The morphable-devices are used as target logic elements by the synthesis tool to process a netlist (either behavioral or gate-level) provided by a user. A synthesis result is provided as a gate-level netlist (such as a Verilog gate-level netlist) expressed as interconnections of morphable-devices. The synthesis tool assumes the morphable-devices represent the final implementation, subject to device sizing to resolve circuit timing issues.

The morphable-devices are, however, subject to additional modifications in the structured array design flow context (see "Structured Arrays", elsewhere herein), as each morphable-device is implementable in a plurality of manners using varying resources (such as cells) of the structured array. During phases of resource reconciliation (where attempts are made to satisfy required resources with locally available resources), one or more of the morphable-devices are selectively transformed to a logically equivalent implementation. For example, an AND function is implementable by an AND gate, by a NAND gate and an Inverter, or by any other equivalent formulation. Functionally equivalent alternatives are grouped according to implementation function, and individual realizations within a given function are referred to as "forms". Thus any morphable-device is implementable as any instance of any form having an equivalent function. Subsequent operations account for variation between logically equivalent forms (such as differences in area, timing behavior, routing resources used or provided, and any other characteristic distinguishing one form from another). Operations relating to interchanging realizations of morphable-devices to satisfy structured array resource limitations and underlying topology, as well as meeting spatial organization constraints, are termed "morphing".

The SDI-directed placement, in various contexts including structured array design flows, includes several phases: global placement, legalization, and detailed placement. Global placement, in certain embodiments, provides a first-cut location for each morphable-device in a netlist. The first-cut location is subject to additional refinement by subsequent processing (including legalization and detailed placement). Global placement is considered complete when a configuration is attained that is determined to be sufficiently close to legality to proceed to legalization, i.e. the configuration is likely to be reducible to a satisfactory implementation. Legalization starts with the global placement configuration and produces a final configuration where demand for resources in every region is determined to be no greater than corresponding supply in each region. Detailed placement starts with the legalized placement configuration and assigns every element implementing a morphable-device to specific resources in an implementation (such as a set of specific resource-slots in a structured array architecture). Some simple functions have forms requiring only a single resource instance, whereas more complex forms are composite, requiring more than one physical resource instance plus internal interconnect to implement the function.

The resources, in some embodiments, do not have fixed and unchangeable types, and the demand for resources is satisfiable either by morphing of morphable devices to better fit the supply of resources, or by mutating of mutable ones of the resources to better fit the demand. Mutable resources (also called mutable cells or alterable cells) are selectively enabled to have one of a plurality of types depending upon a "personalization" of the mutable resource. In some embodiments, such as embodiments using a structured array fabric, the mutable resources are defined in a predefined base array portion of an integrated circuit (such as a number of lower layers of the integrated circuit), and the personalization is defined as part of higher layers of the integrated circuit, such as in an application-specific wiring interconnect pattern using the higher layers. According to various embodiments, the resource types selected by personalization of mutable resources include one or more of: sequential logic resources (such as flip-flops); combinational logic resources (such as MUXes); combinational logic resources with a low drive strength; and combinational logic resources with a high drive strength. In some embodiments, two or more mutable resources of a first resource type are mutated to or from a mutable resource of a second type. In a first example, two combinational logic resources are mutated to form a sequential resource. In a second example, two combinational logic resources with a low drive strength are mutated to form a combinational logic resources with a high drive strength. In a third example, a sequential resource is mutated to form two combinational logic resources.

In some embodiments, mutating is managed in association with morphing. A morphable-device having a particular function is implemented as an instance of a form including one or more mutable resources, and the mutable resources are personalized in accordance with the particular function. According to various embodiments, the particular function is one or more of: a sequential function (such as a latch or a flip-flop); a combination logic function (such as a MUX); and any combination of the foregoing (such as a scan flip-flop). For example, a particular morphable device has a function of a MUX-flip-flop (such as a scan flip-flop). In a first example realization (form) of the particular morphable device, a dedicated (e.g. non-mutable) flip-flop resource is combined with one or more dedicated (e.g. non-mutable) combinational logic resources implementing the MUX portion of the MUX-flip-flop function. In a second example realization of the particular morphable device, a mutable resource is personalized to be a flip-flop (sequential) resource, and the flip-flop resource is combined with one or more dedicated combinational logic resources implementing the MUX portion of the MUX-flip-flop function. In a third example realization of the particular morphable device, a dedicated flip-flop resource is combined with a mutable resource personalized to be a MUX (combinational logic) resource. As shown by these examples, the mutable resources are usable similarly to dedicated (e.g. non-mutable) resources, and the resource types of the mutable resources are changeable to fit needs of an application.

Various morphing, mutating, and similar transformation operations are usable in any combination of phases including global placement, legalization, and detailed placement, according to various embodiments. Morphing and/or mutating techniques used in one phase are distinct or alternatively substantially similar to techniques used in another phase, varying according to implementation. In some embodiments, different processing phases proceed with morphing operations according to respective morphing classes, i.e. a set of morphing classes for global placement, a set of morphing classes for legalization, and set of morphing classes for detailed placement. In various embodiments, one or more of the morphing classes includes forms using mutable resources. The morphing classes according to phases are distinct or alternatively substantially similar to one another, according to embodiment. In some embodiments, different processing phases are enabled to use different mutating operations. For example, legalization is enabled to mutate resources between combinational logic and sequential resource types, and detailed placement is enabled to mutate resources between differing types of combinational logic resources, such as altering a drive strength.

SDI-directed placement operations, when applied in a structured array design flow context, optionally include specialized forces relating to various "morphing classes" representing categories of structured array resources or related functionality. As an example, resources for combinational circuitry are grouped in a combinational morphing class, while resources for sequential circuitry are grouped in a sequential morphing class. In various embodiments, a mutable resource is grouped in a morphing class according to a (current) resource type of the mutable resource. In other embodiments, a mutable resource is enabled to be in more than one morphing class at a same time. For example, a particular pair of mutable cells is usable, via personalization, as either a pair of independent combinational logic resources, or a sequential resource. Each of the pair of cells is in a combinational morphing class, and the pair of cells as a unit is in a sequential morphing class.

In some situations morphable-devices are restricted to implementation by resources belonging to a limited set of morphing-classes. For example, combinational logic morphable-devices are optionally restricted to implementation by resources of the combinational morphing class, while sequential logic morphable-devices are optionally restricted to implementation by sequential morphing class elements. One or more specialized forces relating to each of the morphing classes are optionally used during global placement to effect spreading of morphable-devices according to corresponding morphing classes. Continuing with the example, a combinational spreading force is selectively applied to combinational logic morphable-devices, while a sequential spreading force is selectively applied to sequential logic morphable-devices. In certain embodiments, it is useful to subject all devices in a netlist (whether morphable or not) to a single spreading force that acts to drive a placement toward a density that is sustainable on an implementation architecture, and augment the spreading force with specialized resource-class-specific spreading forces to further tune the placement.

Structured Arrays

In some usage scenarios, structured arrays are implementation vehicles for the manufacture of integrated circuits, as described elsewhere herein. Structured arrays, in certain embodiments, include fundamental building blocks (known as "tiles") instantiated one or more times across an integrated circuit substrate to form a Structured Array Fabric (SAF). In some embodiments, structured arrays are homogeneous (i.e., all of the tiles are identical), while in some embodiments the arrays are heterogeneous (i.e., some of the tiles are distinct with respect to each other). Heterogeneity may occur as a result of tile type, arrangement, or other differences. Regardless of tile number and arrangement, however, the SAF tiles are fixed (i.e., prefabricated) and independent of any specific design implemented thereupon.

SAF tiles, according to various embodiments, include any combination of fully or partially formed active elements (such as transistors, logic gates, sequential elements, mutable elements, and so forth), as well as fully or partially formed passive elements (such as metallization serving as wires and vias providing interconnection between layers of metal). In some SAF embodiments "lower" layers of interconnect are included in SAF tiles (as the lower layers are formed relatively early in fabrication), while "upper" ("higher") layers of interconnect are specific to a design (as the upper layers are formed relatively later in fabrication). Such SAF embodiments permit the lower prefabricated (and thus non-customizable) layers to be shared between different design implementations, while the higher/customizable layers provide for design-specific specialization or personalization.

SAF structures are usable to construct an entire chip, or alternatively constitute only a portion of the floorplan of an encompassing circuit, allowing for design variation. The size of the SAF tiles is generally irrelevant to design flows, and in various usage scenarios, a tile is as small and simple as a single inverter or alternatively as large and complex as a Randomly Accessible read-write Memory (RAM) block or other large-scale Intellectual Property (IP) element.

EDA flows targeting designs based on structured array technology (such as the SDI-directed flow described elsewhere herein) account for the predetermined nature of the array, from gate-level netlist synthesis through subsequent implementation processing including layout of cells and interconnect. Such EDA flows enable realizing advantages of manufacture of integrated circuits including SAF tiles. The advantages include reduced manufacturing cost, as fewer photomask layers (for example those corresponding to upper layers of interconnect) are customized for each design, as well as reduced characterization cost (for example by re-use of known structures such as the SAF tiles).

Acronyms

Elsewhere herein various shorthand abbreviations, or acronyms, are used to refer to certain elements. The descriptions of at least some of the acronyms follow.

| Acronym | Description |
| --- | --- |
| ASIC | Applications Specific Integrated Circuit |
| CMOS | Complementary Metal Oxide Semiconductor |
| EDA | Electronic Design Automation |
| FF | Flip-Flop |
| IC | Integrated Circuit |
| I/O | Input/Output |
| MOS | Metal Oxide Semiconductor |
| MUX | Multiplexer |
| SAF | Structured Array Fabric |
| SDI | Simultaneous Dynamical Integration |
| XOR | eXclusive OR |

Example Embodiments

In concluding the introduction to the detailed description, what follows is a collection of example embodiments, including at least some explicitly enumerated as "ECs" (Example Combinations), providing additional description of a variety of embodiment types in accordance with the concepts described herein; these examples are not meant to be mutually exclusive, exhaustive, or restrictive; and the invention is not limited to these example embodiments but rather encompasses all possible modifications and variations within the scope of the issued claims.

EC1) An integrated circuit including:
    a predefined base array containing a plurality of primitives, each of the primitives being of one of a plurality of types, at least one of the types being a mutable cell type;
    a wiring interconnect pattern that personalizes the predefined base array in accordance with an application;
    wherein each of the primitives of the mutable cell type includes a plurality of respective transistors and respective wiring, the respective wiring connecting at least some of the respective transistors; and
    wherein each of a first one or more of the primitives of the mutable cell type is enabled to be managed as a respective sequential resource, and each of a second one or more of the primitives of the mutable cell type is enabled to be managed as a respective plurality of combinational logic resources.

The integrated circuit of EC1, wherein the wiring interconnect pattern is enabled to be defined, at least in part, via synthesis of the application, the synthesis targeting, at least in part, the resources.

The integrated circuit of EC1, wherein the sequential resources are flip-flops.

The integrated circuit of EC1, wherein the combinational logic resources include one or more of multiplexers, exclusive OR gates, and exclusive NOR gates.

The integrated circuit of EC1, wherein a particular one of the pluralities of combinational logic resources is two multiplexers.

The integrated circuit of EC1, wherein at least some of the pluralities of combinational logic resources include one or more of multiplexers, exclusive OR gates, and exclusive NOR gates.

The integrated circuit of EC1, wherein a technology of the integrated circuit is one or more of Metal Oxide Semiconductor (MOS), Complementary Metal Oxide Semiconductor (CMOS), BiCMOS (Bipolar CMOS), Silicon Germanium (SiGe), Indium Phosphide (InP), Emitter-Coupled Logic (ECL), Gallium Arsenide (GaAs), and Silicon On Insulator (SOI).

EC2) The integrated circuit of EC1, wherein the predefined base array uses one or more of a plurality of layers of the integrated circuit up through a particular one of the layers.

The integrated circuit of EC2, wherein the particular layer is a first layer of metal.

The integrated circuit of EC2, wherein the particular layer is a second layer of metal.

The integrated circuit of EC2, wherein the particular layer is a contact layer.

The integrated circuit of EC2, wherein the wiring interconnect pattern uses ones of the layers above the particular layer.

EC3) The integrated circuit of EC2, wherein the wiring interconnect pattern uses ones of the layers at and above the particular layer.

The integrated circuit of EC3, wherein the particular layer is shared by the wiring interconnect pattern and the predefined base array.

EC4) An integrated circuit including:
a predefined base array containing a plurality of primitives, at least some of the primitives being organized into clusters, the clusters including adjoined pluralities of the primitives;
a wiring interconnect pattern that personalizes the predefined base array in accordance with an application;
wherein each of the at least some of the primitives includes a plurality of respective transistors and respective wiring, the respective wiring connecting at least some of the respective transistors; and
wherein each cluster is placement-time mutable into a resource of a respective one of a plurality of resource types, the resource types including
a plurality of distinct combinational logic resources of a first drive strength,
at least one combinational logic resource of a second drive strength greater than the first drive strength, and
at least one sequential resource.

The integrated circuit of EC4, wherein the placement-time mutation of a particular one of the clusters is accomplished via constraining a selected portion of the wiring interconnect.

EC5) The integrated circuit of EC4, wherein the predefined base array includes one or more regions, and the at least some of the primitives are in a particular one of the regions.

The integrated circuit of EC5, wherein at least one of the regions is an Input/Output (I/O) region.

The integrated circuit of EC5, wherein at least one of the regions is a Structured Array Fabric (SAF) region.

The integrated circuit of EC5, wherein the particular region is a Structured Array Fabric (SAF) region.

The integrated circuit of EC5, wherein each of at least some of the regions are one or more of
an Input/Output (I/O) region,
a gate array region,
a sea of cells region,
a field-programmable region,
a memory region,
a random access memory region,
a read-only memory region,
an electrically erasable read-only memory region, and
a Structured Array Fabric (SAF) region.

EC6) A cell design for use in a predefined base array, the cell design including:
one or more transistors arranged according to a layout;
one or more lower-layer wires interconnecting at least some of the transistors; and
wherein by adding five or fewer higher-layer wires, each of the higher-layer wires connecting a respective pair of points in the cell design, the cell design is enabled to function as a sequential logic element.

The cell design of EC6, wherein the higher-layer wires are not part of the predefined base array.

EC7) The cell design of EC6, wherein without the addition of the higher-layer wires, the cell design is not capable of functioning as a sequential logic element.

The cell design of EC7, wherein at least one of the higher-layer wires completes a feedback connection of the sequential logic element.

The cell design of EC6, further including one or more power and/or ground connections.

EC8) The cell design of EC6, further including one or more connection points.

The cell design of EC8, wherein the connection points are defined in a contact photomask.

The cell design of EC8, wherein the connection points are vias.

The cell design of EC8, wherein each point of the respective pairs of points is one of the connection points.

The cell design of EC6, wherein the sequential logic element is a flip-flop.

EC9) The cell design of EC6,
wherein the five or fewer higher-layer wires are a first set of higher-layer wires; and
wherein by adding a second set of three or fewer higher-layer wires, each of the second set of higher-layer wires connecting a respective pair of points in the cell design, the cell design is enabled to function as a plurality of combinational logic elements.

The cell design of EC9, wherein the combinational logic elements are one or more of multiplexers, exclusive OR gates, and exclusive NOR gates.

EC10) The cell design of EC6,
wherein the five or fewer higher-layer wires are a first set of higher-layer wires; and
wherein by adding a second set of one or fewer higher-layer wires, each of the second set of higher-layer wires connecting a respective pair of points in the cell design, the cell design is enabled to function as a plurality of combinational logic elements.

The cell design of EC10, wherein the combinational logic elements are multiplexers.

EC11) A method including:
based on a netlist, establishing a legal global placement of at least some of a plurality of devices of the netlist in an integrated circuit, the integrated circuit including a predefined base array;
determining, in each of a plurality of constraint regions of the integrated circuit, a respective utilization of sequential ones of the devices and a respective utilization of combinational ones of the devices;
modifying, in at least some of the constraint regions, a balance of sequential resources and combinational logic resources; and
performing detail placement.

The method of EC11, wherein the at least some of the constraint regions are determined, at least in part, according to the utilizations.

The method of EC11, wherein the modifying is in accordance with the respective utilizations.

EC12) The method of EC11, wherein the modifying includes selecting particular ones of the resources, and mutating the resources.

EC13) The method of EC12, wherein the mutating of a first one of the particular resources is accomplished, at least in part, via changing a wiring pattern of the first resource.

The method of EC13, wherein the changing is according to the predefined base array, but does not modify the predefined base array.

The method of EC11, further including mapping each of the devices to one or more of the resources.

The method of EC11, wherein the performing is within each constraint region.

EC14) The method of EC11, wherein the devices are according to a standard cell library.

The method of EC14, wherein the standard cell library is used with other integrated circuits not having a predefined base array.

EC15) A method including:
mapping elements of an application into resource classes of a predefined base array, some or all of the resource classes being mutable resource classes;
performing a detail placement of the mapped elements into resources of the predefined base array, each of the resources belonging to a respective one of the resource classes, some or all of the resources being mutable resources belonging to one of the mutable resource classes, each of the mutable resources having a respective function that is selectively a respective default function or a respective secondary function;
selecting at least some of the mutable resources; and
mutating the at least some of the mutable resources.

EC16) The method of EC15, wherein the mutating of a particular one of the at least some of the mutable resources changes the respective function of the particular mutable resource from the respective default function to the respective secondary function.

EC17) The method of EC16, wherein the particular mutable resource is enabled to perform one of a plurality of functions.

The method of EC17, further including assigning, prior to the performing, the respective default function to selectively be one of the functions.

EC18) The method of EC15, wherein the selecting is based, at least in part, on a first placement of the elements.

The method of EC18, wherein the first placement is a global placement.

EC19) The method of EC15, wherein the selecting is based, at least in part, on a density of utilization of the default functions and the secondary functions.

The method of EC19, further including computing the densities in each of a plurality of constraint regions of the predefined base array.

The method of EC15, wherein the mutating is prior to the performing

The method of EC15, wherein the mutating of a particular one of the at least some of the mutable resources includes changing a wiring pattern of the particular mutable resource from a first wiring pattern associated with the respective default function to a second wiring pattern associated with the respective secondary function.

The method of EC15, wherein for at least one of the at least some of the mutable resources, the respective default function is a sequential function and the respective secondary function is a combinational function.

The method of EC15, wherein for at least one of the at least some of the mutable resources, the respective default function is a combinational function and the respective secondary function is a sequential function.

The method of EC15, wherein for at least one of the at least some of the mutable resources, the respective default function includes a combinational function with a particular drive strength, and the respective secondary function includes the combinational function with a higher drive strength.

EC20) A method including:
performing a layout of a plurality of transistors and a plurality of wires, the wires interconnecting the transistors, the layout including a sequential logic element;
selecting a subset less than all of the wires, at least a particular one of the wires of the subset being a portion of a feedback connection of the sequential logic element;
instantiating the layout without the subset in a plurality of locations in a predefined base array;
personalizing, via wiring, the predefined base array in accordance with an application, the wiring at a first one of the locations replacing the respective particular wire, the wiring at a second one of the locations not replacing the respective particular wire; and
using, via the application, the first location as a sequential resource and at least a portion of the second location as a combinational logic resource.

The method of EC20, wherein the replacing is via an electrically equivalent wire.

The method of EC20, wherein the replacing is via a physically equivalent wire.

The method of EC20, wherein the personalizing of the second location connects via the wiring a particular one of the respective transistors of the second location, and the personalizing of the first location does not connect a corresponding one of the respective transistors of the first location.

The method of EC20, wherein the layout represents a mutable cell.

EC21) A method including:
fabricating a predefined base array, the predefined base array containing a plurality of primitives, each of the primitives being of one of a plurality of types, at least one of the types being a mutable cell type;
managing, via placement software, each of a first one or more of the primitives of the mutable cell type as a sequential resource, and each of a second one or more of the primitives of the mutable cell type as a plurality of combinational logic resources; and using, via an application, each of the first one or more of the primitives as a sequential logic element and at least a portion of each of the second one or more primitives as a combinational logic element.

EC22) The method of EC21, further including personalizing, via a wiring interconnect pattern, the predefined base array in accordance with the application.

EC23) The method of EC22, wherein the personalizing adds respective internal connections within each of the first one or more of the primitives.

The method of EC23, wherein at least some of the respective internal connections complete a feedback path.

The method of EC22, wherein the personalizing adds respective internal connections within each of at least some of the second one or more of the primitives.

EC24) The method of EC21, further including mutating, via the placement software, each of a third one or more of the primitives of the mutable cell type.

EC25) The method of EC24, wherein the mutating changes a respective resource class of the third one or more of the primitives from a sequential resource class to a combinational logic resource class.

The method of EC25, wherein the third one or more of the primitives include at least some of the second one or more of the primitives.

The method of EC24, wherein the third one or more of the primitives include at least some of the first one or more of the primitives.

EC26) The method of EC21, further including using, via the application, each of at least some of the second one or more primitives as a plurality of combinational logic elements.

EC27) A method for detail placement, the method including:
based on a netlist, establishing a legal global placement of at least a portion of an integrated circuit;
after the legal global placement is established,
elaborating the netlist with resource-level nodes, each of the resource-level nodes associated with a respective resource-level macro, and
prioritizing resource classes within constraint regions using an objective function;
performing detail placement within each constraint region by processing the resource classes in priority order until all of the resource-level macros have been placed, the processing for each resource class including
performing simultaneous dynamical integration of an analogous system of forces acting, at least in part, on the resource-level nodes of the elaborated netlist until a detail placement stopping criteria is reached, and
with respect to the resource-level nodes of the resource class being processed, constructing assignments to respective ones of a plurality of slots for the resource-level nodes, assigning the respective resource-level macros to the respective slots, and locking the resource-level nodes into position so that the resource-level nodes no longer move; and
after the establishing and before the processing of the resource classes, performing mutating of at least some mutable ones of the slots.

The method of EC27, wherein the netlist prior to elaborating is a form-level netlist and wherein the legal global placement is established via simultaneous dynamical integration of an analogous system of forces acting on the nodes of the form-level netlist, the integration being continued until a global placement stopping criteria is reached.

The method of EC27, wherein the establishing performs legalization using q-blocks, the resource-level nodes are constrained within the q-blocks, and the mutating after the establishing is performed to balance the demand for resources against the supply thereof within each of the q-blocks.

EC28) The method of EC27, wherein each one of the slots belongs to one of the resource classes.

EC29) The method of EC28, wherein, prior to the performing mutating, a particular one of the mutable slots belongs to a first one of the resource classes, and subsequent to the performing mutating, the particular slot belongs to a second one of the resource classes.

The method of EC29, wherein the first resource class solely includes sequential logic elements, and the second resource class solely includes combinational logic elements.

The method of EC29, wherein the first resource class solely includes combinational logic elements, and the second resource class solely includes sequential logic elements.

EC30) The method of EC27, wherein the performing mutating changes a drive strength of a particular one of the mutable slots.

The method of EC30, wherein the performing mutating combines two of the slots.

EC31) A method for detail placement, the method including:
based on a netlist, establishing a legal global placement of at least a portion of a plurality of elements of an integrated circuit;
after the legal global placement is established,
elaborating the netlist with resource-level nodes, each of the resource-level nodes associated with a respective resource-level macro, and
prioritizing resource classes within constraint regions using an objective function;
performing detail placement within each constraint region by processing the resource classes in priority order until all of the resource-level macros have been placed in respective ones of a plurality of slots; and
after the establishing and before the processing of the resource classes, performing mutating of at least some mutable ones of the slots.

The method of EC31, wherein the establishing performs legalization using q-blocks, the resource-level nodes are constrained within the q-blocks, and the mutating is performed to balance the demand for resources against the supply thereof within each of the q-blocks.

EC32) The method of EC31, wherein each one of the slots belongs to one of the resource classes.

The method of EC32, wherein, prior to the performing mutating, a particular one of the mutable slots belongs to a first one of the resource classes, and subsequent to the performing mutating, the particular slot belongs to a second one of the resource classes.

The method of EC31, wherein the performing mutating changes a drive strength of a particular one of the mutable slots.

Mutable Cells

FIG. 1 illustrates selected details of an embodiment of a mutable cell. The mutable cell includes one or more components. According to various embodiments, the components include zero or more of: transistors (such as transistor 102); inverters or other logic gates (such as inverter 104); wires interconnecting the transistors and invertors (such as wire 106); and connection points (such as connection points 110, 112, 116, 118, 120, 122, 124, 128, 130, 132, 134, 138, 140, and 142). In various embodiments, the inverters (or other logic gates) are transistors and wires, and illustrating inverters in FIG. 1 is a shorthand notation for a transistor-level illustration.

In some embodiments, the transistors and inverters are part of an integrated circuit, and the wires are instantiated in one or more layers of any combination of polysilicon, metal, or any suitable conductor of the integrated circuit, such as the lowest layer(s) of metal. In further embodiments, the connection points represent contacts and/or vias enabling higher layers of metal (such as layers higher than those used for the wires of the mutable cell) to connect to the components of the mutable cell. According to various embodiments, the connection points are used for one or more of: personalizing the mutable cell, such as by providing additional wires interconnecting components of the mutable cell; and providing external connections to the mutable cell, such as for inputs and/or outputs of a function, such as a sequential or combinational logic function, implemented by a personalized version of the mutable cell. In some embodiments, the mutable cell is instantiated in a predefined base array portion of the integrated circuit.

An arrangement of the components of the mutable cell illustrated in FIG. 1 is not representative of a physical layout of the mutable cell. In some embodiments, in the physical layout, the components are topologically arranged to optimize properties of the mutable cell, such as to minimize area, to reduce capacitance, to improve timing, or to enable connection(s) to the mutable cell via the connection points. According to various embodiments, one or more of: the mutable cell is laid out as a sequential logic element, such as a flip flop; a layout of the mutable cell includes a sequential logic element; and a layout of the mutable cell includes a layout of a sequential logic element, but optionally excludes one or more wires of the layout. In some embodiments, the excluded wires include one or more of the wires that form a feedback path, such as a feedback connection in a sequential logic element. For example, a wire between connection points 128 and 130, or a wire between connection points 138 and 142, is a portion of a feedback path.

In some embodiments, the mutable cell is laid out such that, via personalization of the mutable cell (such as by adding one or more connections between various ones of the connection points), the mutable cell is usable as either a sequential logic element, or as one or more combinational logic elements.

In some embodiments, a layout of a mutable cell is designed such that some or all of the desired mutable connections are optionally and/or selectively made without consuming significant extra area, as compared to a non-mutable cell having similar functionality. In various embodiments, there is only one required connection and one optional connection needed to use a mutable cell having an optional sequential logic function as a cell having two, independent, combinational logic functions, such as two multiplexers or two exclusive OR gates. In some embodiments, most of a difference between a mutable cell and a non-mutable cell having similar functionality is that some connections necessary in the non-mutable cell are not included (excluded) in the mutable cell. In some embodiments and/or usage scenarios, the excluded connections are added back later (such as after the mutable cell is instantiated in a predefined base array) if the mutable cell is to be used as a sequential logic element. In some embodiments, excluding certain connections does not materially increase a size of the mutable cell. In various embodiments, a second set of connections, different from the excluded connections, enables the mutable cell to be used as a plurality of combinational logic elements, such as two multiplexers or two exclusive OR gates.

In some embodiments, the mutable cell includes one or more components that are not necessary in a personalization of the mutable cells as a sequential logic element. For example, extra inverters are included in the mutable cell, in some embodiments, to optionally and/or selectively provide additional buffering, or to enable the mutable cell to be used for additional functions.

Figure 2A:
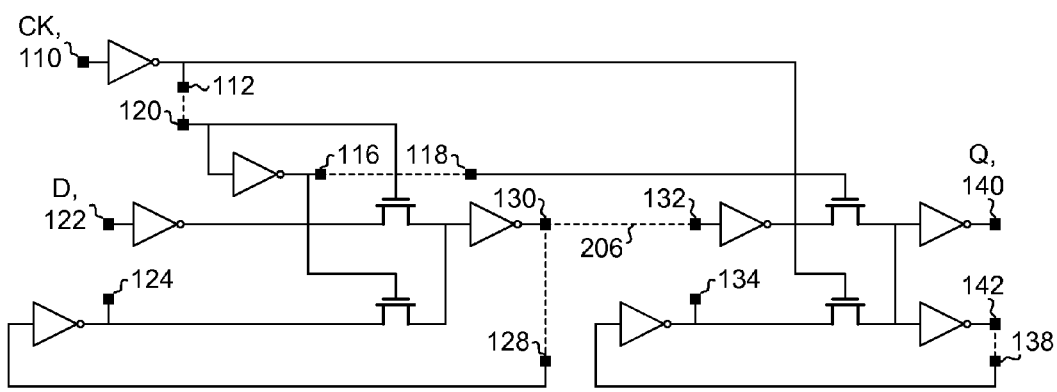
FIG. 2A illustrates selected details of an embodiment of a mutable cell with additional interconnects for use as a sequential logic resource.
Figure 2B:
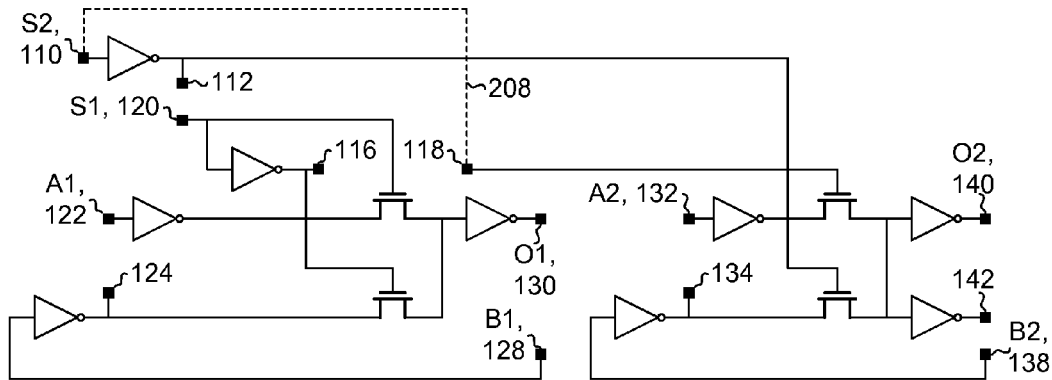
FIGS. 2B-2D illustrate selected details of embodiments of mutable cells with additional interconnects for use as a pair of combinational logic resources.
Figure 2C:
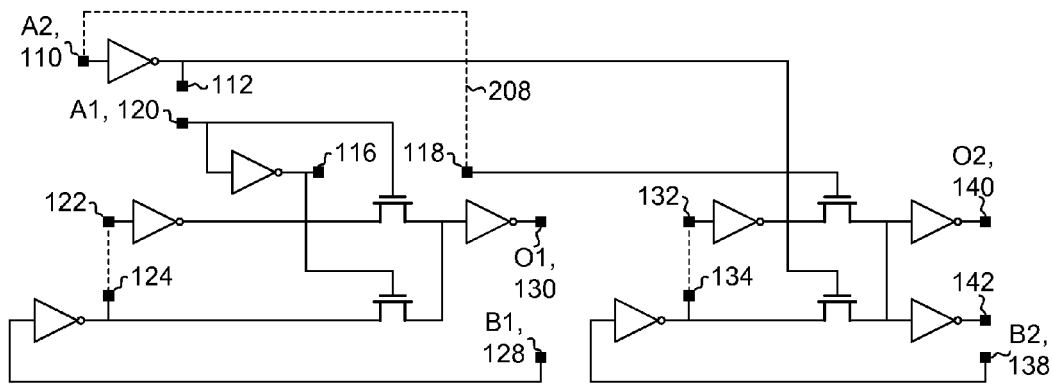
Figure 2D:
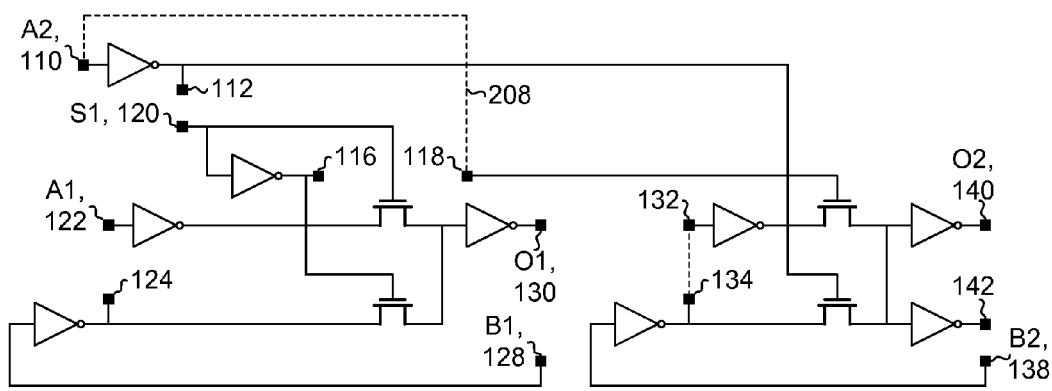

FIG. 2A illustrates selected details of an embodiment of a mutable cell with additional interconnects for use as a sequential logic resource. FIGS. 2B-2D illustrate selected details of embodiments of mutable cells with additional interconnects for use as a pair of combinational logic resources. The components of the mutable cells of FIGS. 2A-2D are the same as and are arranged in a same way as the mutable cell of FIG. 1, except for additional interconnects (i.e., wires) illustrated as dashed lines, such as interconnect 206 (in FIG. 2A) or interconnect 208 (in FIGS. 2B-2D). In some embodiments, the interconnects illustrated as dashed lines in FIGS. 2A-2D are added in higher layers of metal than the wires of the mutable cells (illustrated as solid lines). In further embodiments, the mutable cells are part of a predefined base array, and the interconnects illustrated as dashed lines represent personalization of the predefined base array for a given application.

Continuing in FIG. 2A, adding interconnects (personalization) between connection points 112 and 120, between connection points 116 and 118, between connection points 128 and 130, between connection points 138 and 142, and between connection points 130 and 132 enables the mutable cell to be used as a sequential logic element. For example, the interconnect between connection points 128 and 130 is a feedback connection in a master portion of the sequential logic element, and the interconnect between connection points 138 and 142 is a feedback connection in a slave portion of the sequential logic element. Further with the example, the interconnect between connection points 130 and 132 is a coupling connection between the master and slave portions of the sequential logic element. With the added interconnects, connection point 110 is a clock (CK) input of the sequential logic element, connection point 122 is a data (D) input of the sequential logic element, and connection point 140 is a Q output of the sequential logic element.

In some embodiments, one or more of the added interconnects correspond to and/or replace wires that were excluded from a layout of the mutable cell, the excluded wires from a portion of the layout corresponding to feedback paths of a sequential logic element. The one or more added interconnects correspond physically, electrically, or both to the excluded wires.

In FIG. 2B, adding an interconnect between connection points 110 and 118 enables the mutable cell to be used as one or more combinational logic elements, specifically as a pair of two-to-one multiplexers (MUXes). With the added interconnect, connection points 120 (S1) and 110 (S2) are the respective select inputs of the MUXes, connection points 122 (A1) and 132 (A2) are the respective first data inputs of the MUXes, connection points 128 (B1) and 138 (B2) are the respective second data inputs of the MUXes, and connection points 130 (O1) and 140 (O2) are the respective data outputs of the MUXes.

In FIG. 2C, adding interconnects between connection points 110 and 118, between connection points 122 and 124, and between connection points 132 and 134 enables the mutable cell to be used as one or more combinational logic elements, specifically as a pair of two-input exclusive OR gates (XORs). With the added interconnect, connection points 120 (A1) and 110 (A2) are the respective first data inputs of the XORs, connection points 128 (B1) and 138 (B2) are the respective second data inputs of the XORs, and connection points 130 (O1) and 140 (O2) are the respective data outputs of the XORs.

In FIG. 2D, adding interconnects between connection points 110 and 118, and between connection points 132 and 134 enables the mutable cell to be used as one or more combinational logic elements, specifically as single two-to-one multiplexer (MUX), and as a single two-input exclusive OR gate (XOR). With the added interconnect, connection point 120 (S1) is the select input of the MUX, connection point 122 (A1) is the first data input of the MUX, connection point 128 (B1) is the second data input of the MUX, and connection point 130 (O1) is the data output of the MUX. With the added interconnect, connection point 110 (A2) is the first data input of the XOR, connection point 138 (B2) is the second data input of the XOR, and connection point 140 (O2) is the data output of the XOR.

Place and Route Flow

Figure 3:
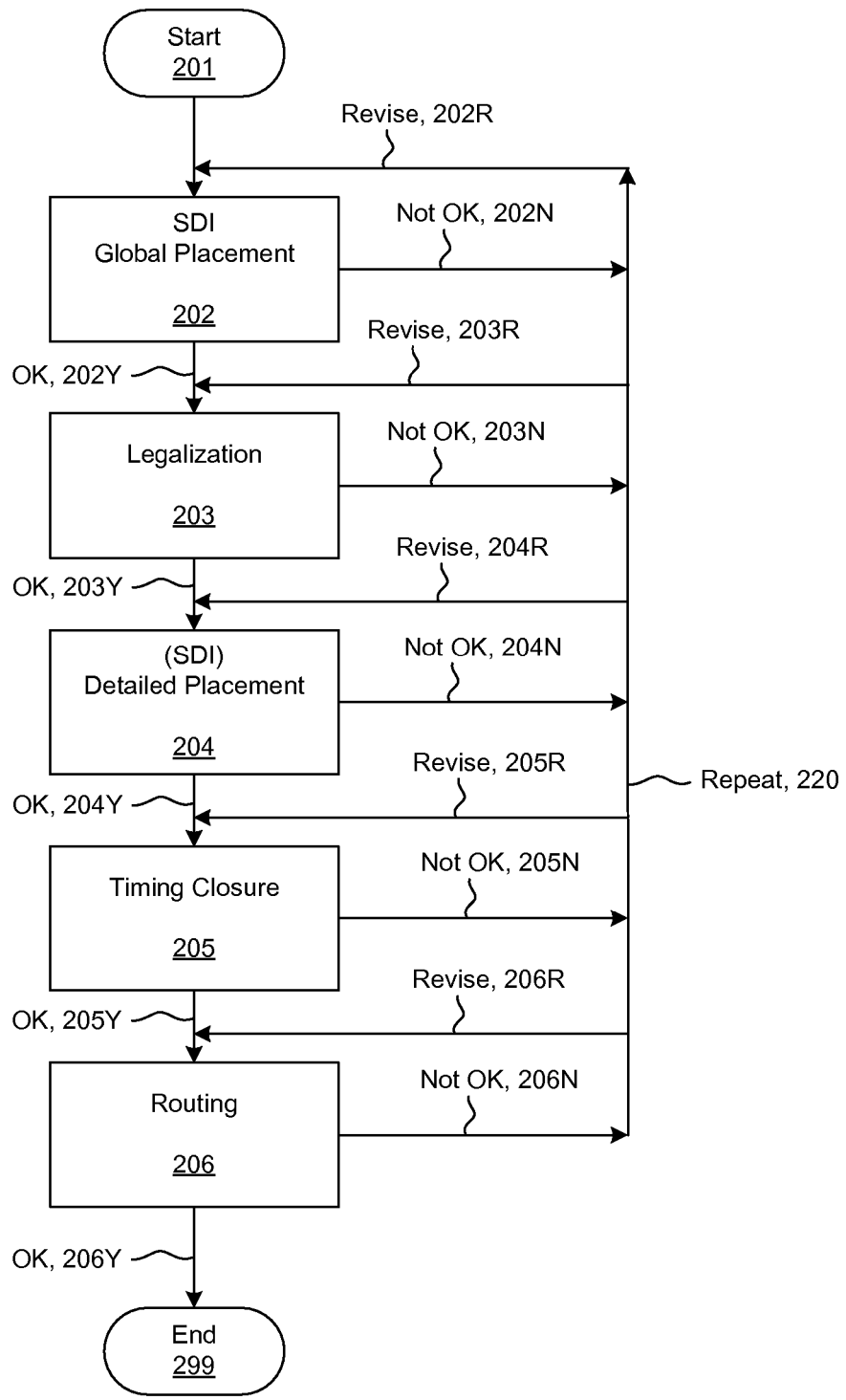
FIG. 3 is a flow diagram illustrating selected details of an embodiment of placing and routing any portion of an integrated circuit according to a Simultaneous Dynamical Integration (SDI)-based flow.

FIG. 3 is a flow diagram illustrating selected details of an embodiment of placing and routing any portion of an integrated circuit, according to an SDI-based flow. Overall the flow includes determining approximate (i.e. subject to subsequent refinement) locations for devices, reconciling resources, determining nearly final locations and implementations for the devices, minimizing critical delay paths, and wiring the devices according to a netlist. In certain embodiments, each of the elements of the flow includes internal functions to determine acceptability of results, iterate as necessary to improve the results, and to direct feedback to earlier processing functions of the flow as needed.

Processing begins ("Start" 201), in certain embodiments, by receiving one or more data structures and files describing a netlist having devices and associated connectivity, along with manufacturing technology information. The structures and files result, in some usage scenarios, from parsing design and technology information. Approximate locations for the devices of the netlist are then determined ("SDI Global Placement" 202) according to the netlist, the technology, and commands/parameters (such as provided by scripts and/or by command line inputs and/or by other parameters). If global placement results are acceptable (i.e. suitable as a starting point for further processing), then flow proceeds ("OK" 202Y). If the global placement results are not acceptable, then flow loops back ("Not OK" 202N, "Repeat" 220, and "Revise" 202R) to repeat all or portions of the global placement. Revised global placement processing (via "Revise" 202R), in certain embodiments, includes modifying any combination of the netlist, global placement commands and parameters, and manufacturing technology (such as specifying a larger die, or a denser device fabrication process) based in part upon previous processing.

Subsequent to acceptable global placement, resources are reconciled according to the global placement and manufacturing information ("Legalization" 203), resulting in elimination of areas of oversubscribed resources. In certain embodiments, modifications are made to the global placement results (effecting "movement" of placed elements) thus producing a legalized placement. If legalization results are acceptable, then flow proceeds ("OK" 203Y). If the legalized placement is not acceptable (or not computed), then flow loops back for additional processing ("Not OK" 203N). In certain embodiments, the additional processing is based on previous processing, and optionally includes repeating any portion of global placement ("Revise" 202R via "Repeat" 220) and continuing onward, or repeating any portion of legalization ("Revise" 203R via "Repeat" 220), according to various usage scenarios and embodiments.

After acceptable legalization, then nearly final (or "exact") locations and implementations for the devices are determined ("(SDI) Detailed Placement" 204). Relatively small-scale adjustments are made to legalization results, via any combination of placed element movement and placed element implementation, according to embodiment. In certain structured array embodiments, the placed element implementation includes one or more of: morphing of selected devices to functionally equivalent alternatives; and mutating of resources (slots of the structured array). If detailed placement results are acceptable, then flow proceeds ("OK" 204Y). If the detailed placement is not acceptable (or not computed), then flow loops back for additional processing ("Not OK" 204N). In certain embodiments, the additional processing is based in part upon previous processing, and optionally includes repeating any portion of previous place and route functions and then continuing onward (such as via any of "Revise" 204R, "Revise" 203R, and "Revise" 202R by way of "Repeat" 220).

Subsequent to detailed placement, delay paths are minimized ("Timing Closure" 205), in certain embodiments, to meet user specified timing, in various ways according to embodiment and/or user option or configuration. In certain embodiments, the detailed placement is analyzed and buffers (or buffer trees) are inserted in high fanout and timing-critical nets. In some embodiments, drivers are resized and optimized to meet maximum capacitance and/or required time constraints with respect to timing critical receivers. In further embodiments, resizing drivers includes mutating of resources to change drive strength. In some embodiments clock networks are synthesized, while in other embodiments the clock networks are predefined. In either case, appropriate clock network elements are inserted into the netlist for clock distribution and to meet clock skew constraints. Further according to embodiment and/or user option or configuration, other timing closure driven optimizations are performed. If the timing closure results are acceptable, then flow proceeds ("OK" 205Y). If the timing closure is not acceptable, then flow loops back for additional processing ("Not OK" 205N). The additional processing optionally includes repeating any portion of previous place and route functions, based in part upon previous processing and then continuing onward (such as via any of "Revise" 205R, "Revise" 204R, "Revise" 203R, and "Revise" 202R by way of "Repeat" 220). Note that in some embodiments flow loops back as a natural consequence of timing closure processing, rather than merely as a result of not-acceptable timing closure results. For example, certain timing closure techniques call for repetition of previous processing (such as one or more of "SDI Global Placement" 202, "Legalization" 203, and "(SDI) Detailed Placement" 204), using various combinations of modified behaviors and parameters, along with optional changes to the netlist and constraints, according to various embodiments.

After timing closure is complete (or considered "close enough"), the resultant devices are wired together according to the resultant netlist ("Routing" 206), and corresponding interconnect is generated. If the routing results are acceptable, then flow proceeds ("OK" 206Y). Place and route processing is then complete ("End" 299), and results are available for further use, such as any combination of analysis and photomask generation. If the routing results are not acceptable, then flow loops back for additional processing ("Not OK" 206N). In certain embodiments, the additional processing is based in part upon previous processing, and optionally includes repeating any portion of previous place and route functions and then continuing onward (such as via any of "Revise" 206R, "Revise" 205R, "Revise" 204R, "Revise" 203R, and "Revise" 202R by way of "Repeat" 220).

Various combinations of place and route processing functions (such as "SDI Global Placement" 202, "Legalization" 203, "(SDI) Detailed Placement" 204, "Timing Closure" 205, and "Routing" 206) optionally includes reading and writing shared information. Examples of shared information include netlists, constraints, progress indicators, and other similar shared processing items. Various combinations of the aforementioned place and route processing functions also optionally include receiving one or more inputs specifying requested behaviors or processing (such as information provided by commands and/or by parameters). Examples of commands and parameters include scripts specifying iteration closure conditions, control parameters, goal descriptions, and other similar information to guide processing. The commands and parameters are optionally provided via any combination of scripts, command line inputs, and graphical user interfaces, according to various embodiments.

In some embodiments, processing of one or more elements of FIG. 3 is optional, or performed only for selected iterations though the illustrated flow. For example, timing closure operations are operative in a first processing mode where legalization and detailed placement are skipped, and processing relating to timing closure is partially performed as part of global placement. Alternatively the first processing mode is viewed as global placement operations being performed to a limited extent, then analyzed and further directed by timing closure operations (without legalization or direct placement), and then additional global placement operations being performed. Eventually a second mode of processing is entered where legalization and detailed placement are performed, optionally followed by additional timing closure operating as in the first mode or operating in a manner specifically tailored to the second mode.

Legalization

Figure 4:
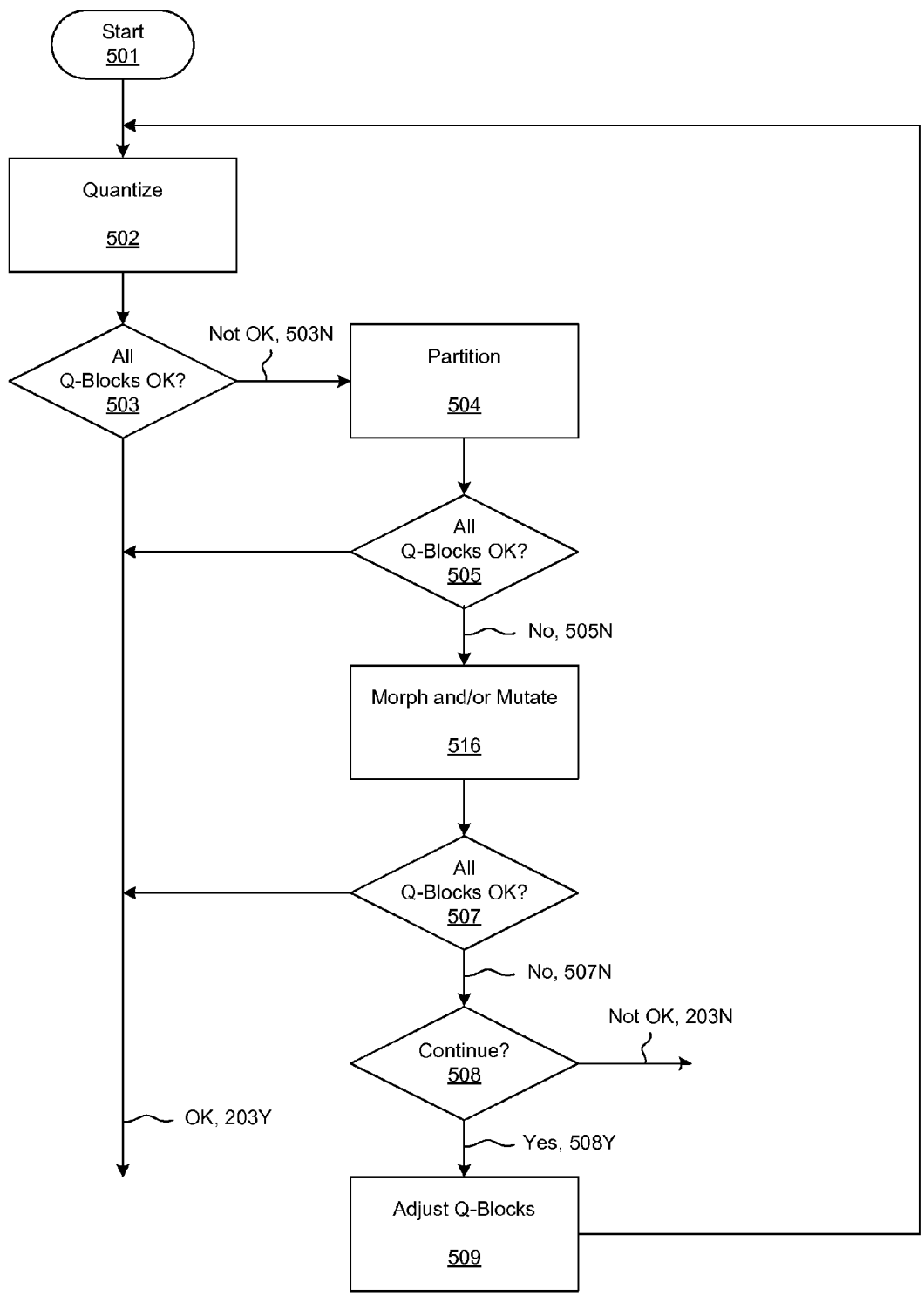
FIG. 4 is a flow diagram illustrating selected details of an embodiment of resource reconciliation, as an example of legalization.

FIG. 4 is a flow diagram illustrating selected details of an embodiment of resource reconciliation, as an example of legalization (such as "Legalization" 203, of FIG. 3). Overall the flow includes determining a size of an analysis window and allocating all devices in groups to their respective containing windows, and sub-dividing and transforming logic functions (such as by morphing) and/or mutating resources to reduce resource over-subscription. The flow also includes checks to determine if the devices allocated to each window are implementable with the resources available in the window (e.g. no analysis window is over-subscribed), and if continued iterations are likely to provide improved results. In a various embodiments, the checks account for various combinations of morphing logic functions to be implemented by the resources and mutating between versions (or types) of the resources.

Processing begins ("Start" 501) with global placement information (such as produced by "SDI Global Placement" 202, of FIG. 3, for example). The global placement result may not be legal (i.e. in a standard cell flow devices may be overlapping, or in a structured array flow more resources may be used than are locally available), but is good enough to continue processing via refinement techniques implemented in legalization. An analysis window is determined ("Quantize" 502), corresponding to a quantization block size, and conceptually replicated in a regular contiguous (but not overlapping) fashion such that all of the devices in the netlist are allocated to one (and only one) window (some windows may be devoid of devices). In some embodiments relating to a structured array design flow, the analysis window is a rectangular shape having a size that is an integer multiple of a corresponding SAF tile. In some embodiments, the analysis window is aligned with respect to SAF tiles.

A first determination as to whether all of the analysis windows (also referred to as quantization blocks or simply "Q-Blocks") are simultaneously legal, e.g. none are over-subscribed, is made ("All Q-Blocks OK?" 503). If all of the Q-Blocks are legal, then legalization processing is complete ("OK" 203Y) and processing continues to detailed placement (see FIG. 3). Otherwise ("No" 503N) the devices are sub-divided ("Partition" 504) via partitioning strategies including any combination of fixed blocks, recursive bisection, and other similar techniques, according to embodiment.

A second legalization check is performed ("All Q-Blocks OK?" 505) that is substantially similar to the first check. As in the first checking case, if all of the Q-Blocks are legal, then processing is complete ("OK" 203Y) and the legalized result is ready for detailed placement. Otherwise ("No" 505N) one or more of several techniques is optionally and/or selectively used ("Morph and/or Mutate" 516). According to various embodiments, one or more of: one or more of the devices of the netlist are transformed (e.g. portions of the netlist are morphed), individually or in groups, to logically equivalent formulations having reduced resource over-subscription; and resources of a structured array fabric are (re)allocated from one version to another (e.g. some of the resources are mutated from one type to another) to balance the demand for the resources against the supply.

The transformation operations are directed to manipulate the netlist such that logic functions requiring resources not available in a Q-Block are implemented as logic functions using resources that are available. As an example, an OR function required in a Q-Block (that is exhausted of OR gates) is implemented instead as a NOR gate followed by an inverting gate, if a NOR gate and an inverting gate are available in the Q-Block. Morphing is usable in various usage scenarios, including structured array regions.

The reallocation operations are directed to manage views of the resources such that additional resources otherwise in short supply (compared to demand) are increased in supply. As an example, a sequential function required in a Q-Block (that is exhausted of sequential resources) is nonetheless enabled to be implemented by reallocation of a pair of combinational resources as a single sequential resource.

Thus, morphing conceptually transforms portions of a netlist, enabling an implementation via a logically equivalent construction, while mutating changes types of available resources (such as by changing particular resources from a combinational type to a sequential type), enabling an implementation with a newly-available resource.

A third legalization check is performed ("All Q-Blocks OK?" 507) that is also substantially similar to the first check. As in the first checking case, if all of the Q-Blocks are legal, then processing is complete ("OK" 203Y) and the legalized result is ready for detailed placement. Otherwise ("No" 507N) a determination is made as to whether further legalization iterations are likely to result in improvement ("Continue?" 508). If continuing is potentially beneficial ("Yes" 508Y), then one or more adjustments are made to the analysis windows ("Adjust Q-Blocks" 509), and flow loops back to repeat processing starting with quantization. In some embodiments, the adjustments include increasing the Q-Block size in one or more dimensions according to a granularity that is an integer multiple of a corresponding dimension of an underlying SAF tile. For example, the Q-Block size starts out as "1 by 1" (i.e. equal in size to the SAF tile), then is increased by one in the first dimension to "2 by 1" (i.e. twice the SAF tile size in the first dimension), and then is increased by one in the second dimension to "2 by 2" (i.e. twice the SAF tile size in the second dimension). Alternatively, the Q-Block size is successively lowered, or increased in one dimension while being decreased in another, according to various embodiments. It is possible for more than one Q-Block size choice to result in legal or otherwise useful results, according to various characteristics of the results (such as minimum and maximum local resource utilization, and other similar metrics).

If it is determined that continuing legalization processing is not useful (i.e. not likely to further a solution), then processing is also complete ("Not OK" 203N) and subsequent processing includes one or more revisions (see FIG. 3). In some embodiments, checking if a Q-Block size equals or exceeds a predetermined value (either before or after one or more adjustments) is part of the continuation determination, as legalization achieved with relatively smaller Q-Block sizes, in some usage scenarios, is more likely to result in successful detailed placement.

Alternative Placement and Legalization

Figure 5:
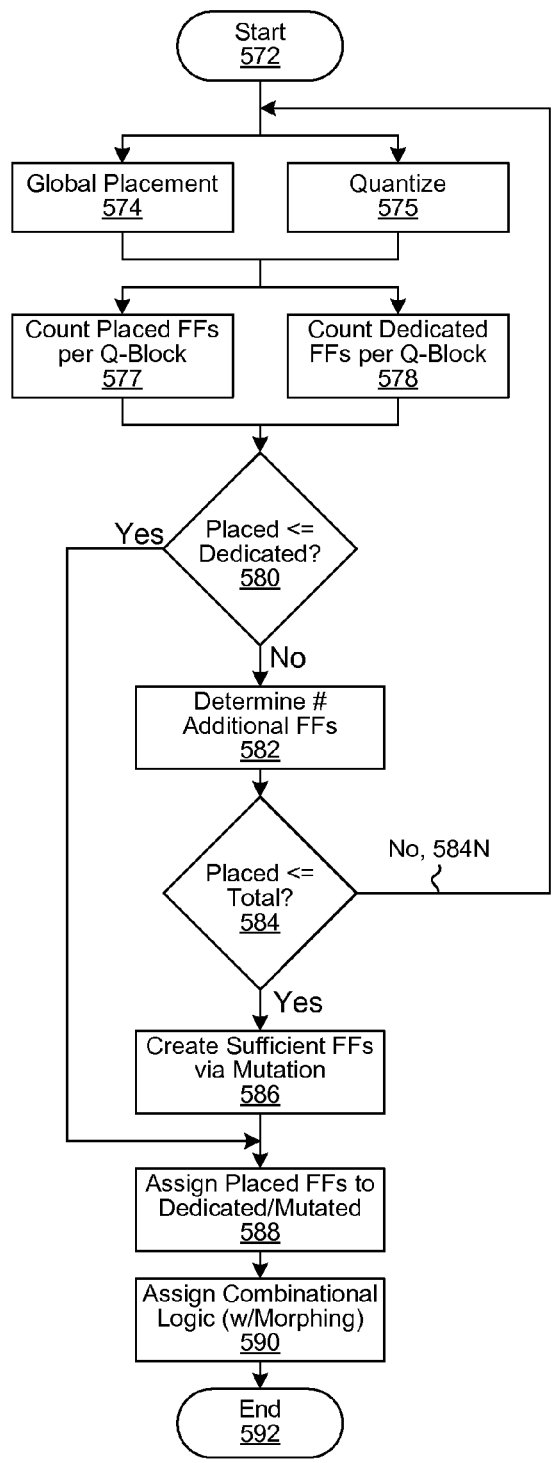
FIG. 5 and FIG. 6 are flow diagrams illustrating selected details of embodiments of placing and legalizing any portion of an integrated circuit.
Figure 6:
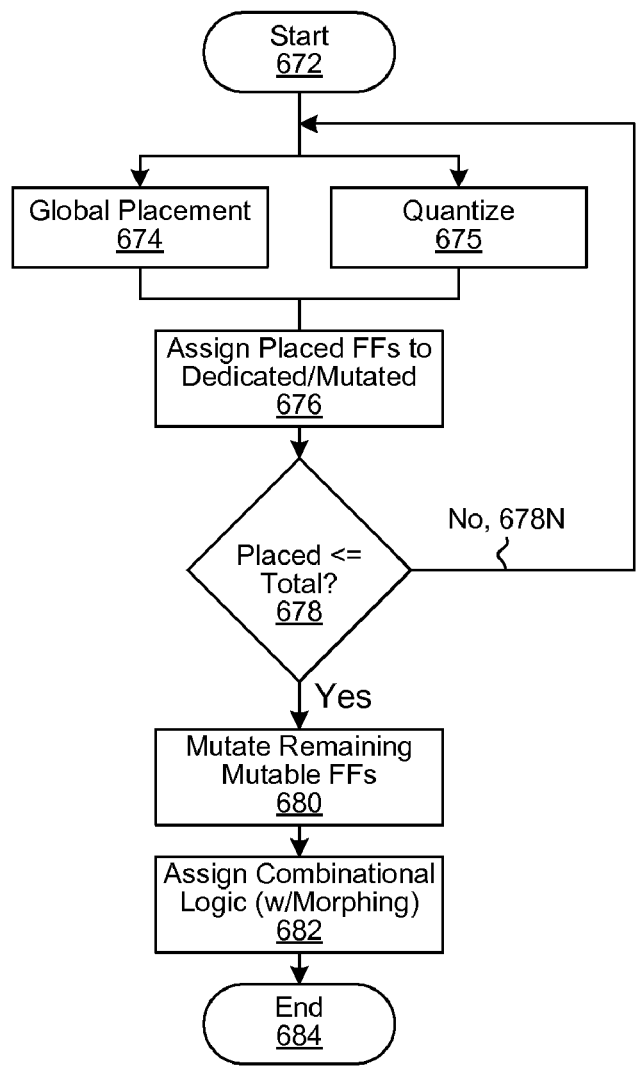

FIG. 5 and FIG. 6 are flow diagrams illustrating selected details of embodiments of placing and legalizing any portion of an integrated circuit. Overall, the flows of FIG. 5 and FIG. 6 include determining approximate (i.e. subject to subsequent refinement) locations for devices, reconciling resources, and determining nearly final locations and implementations for the devices. In certain embodiments, each of the respective elements of each of the flows includes internal functions to determine acceptability of results, iterate as necessary to improve the results, and to direct feedback to earlier processing functions of the respective flows as needed.

The flows of FIG. 5 and FIG. 6 further include determining a size of an analysis window and allocating all devices in groups to their respective containing windows, and sub-dividing and transforming logic functions (such as by morphing) and/or mutating resources to reduce resource over-subscription. The flows also include checks to determine if the devices allocated to each window are implementable with the resources (including, in some embodiments, mutated versions of the resources) available in the window (i.e. no analysis window is over-subscribed).

In some embodiments, the flow of either FIG. 5 or FIG. 6 performs substantially similar functions to that of "SDI Global Placement" 202, "Legalization" 203, and "(SDI) Detail Placement" 204 of FIG. 3, and is used as part of a larger flow, such as that illustrated in FIG. 3.

In some embodiments, the flow of either FIG. 5 or FIG. 6 is performed independently for each Q-block, enabling parallel processing of one or more Q-blocks (e.g. via computations on one or more of the Q-blocks wholly or partially overlapped in time). In other embodiments, a portion of the flow, such as global placement and/or determining analysis windows, is performed for any portion of all Q-blocks via dependent computations or computations that span one or more of the Q-blocks. A remainder of the flow is then performed independently for each Q-block, enabling parallel processing of the remainder of the flow for one or more Q-blocks.

The flow illustrated in FIG. 5 is based on mutable cells having an initial configuration (e.g. type) as combinational (as opposed to sequential) resources (for ones of the mutable cells that are usable as combinational logic resources). Processing begins ("Start" 572), in certain embodiments, by receiving one or more data structures and files describing a netlist having devices and associated connectivity, along with manufacturing technology information. The structures and files optionally result from parsing design and technology information.

Approximate locations for the devices of the netlist are then determined ("Global Placement" 574) according to the netlist, the technology, and commands/parameters (such as those provided by scripts and/or by command line inputs and/or by other parameters). In some embodiments, the approximate locations are determined by SDI techniques, similar to that illustrated by "SDI Global Placement" 202 in FIG. 3.

According to various embodiments, an analysis window is determined ("Quantize" 575) either before, in parallel with, or after the approximate locations ("Global Placement" 574) are determined. The analysis window is determined corresponding to a quantization block size, and conceptually replicated in a regular contiguous (but not overlapping) fashion such that all of the devices in the netlist are allocated to one (and only one) window (some windows may be devoid of devices). In various embodiments, determining the analysis window is performed similarly to "Quantize" 502 as illustrated in FIG. 4.

A count of a number of flip-flops placed (in accordance with the approximate locations) in each Q-block ("Count Placed FFs per Q-Block" 577) is performed.

According to various embodiments, a count of a number of dedicated (non-mutable) flip-flop resources per Q-block ("Count Dedicated FFs per Q-Block" 578) is performed either before, in parallel with, or after the count of the number of placed flip-flops. In some embodiments, the number of dedicated flip-flop resources per Q-block is implicitly known, such as when a Q-block is defined as a number of SAF tiles (and the SAF tiles, by a pre-defined nature, each have a fixed number of dedicated flip-flop resources). In some embodiments, there are no dedicated flip-flop resources (and all the sequential resources are mutable cells).

If the number of placed flip-flops is less than or equal to the number of dedicated flip-flop resources ("Placed <=Dedicated?" 580), then, in some embodiments, flow proceeds to assigning placed flip-flops to flip-flop resources. In other embodiments, a further determination is made as to whether the number of dedicated flip-flop resources is sufficiently larger than the number of placed flip-flops, and flow proceeds to assigning placed flip-flops to flip-flop resources solely if there is enough margin. In some usage scenarios, providing the margin enables improved efficiencies elsewhere. For example, if the number of placed flip-flops equaled the number of dedicated flip-flop resources and no additional margin is provided, there would be less ability to vary the assignment of placed flip-flops based on other constraints, since every flip-flop resource is used.

If more flip-flop resources are needed, then a number of additional flip-flop resources (beyond the dedicated flip-flop resources) is determined ("Determine # Additional FFs" 582). The number of additional flip-flops is determined by subtracting the number of dedicated flip-flop resources from the number of placed flip-flops. A maximum number of additional flip-flop resources (beyond the dedicated flip-flop resources) is determined by counting a number of flip-flop resources that are creatable by mutating mutable cells that are combinational logic resources and are mutable into sequential (e.g., flip-flop) resources.

According to various embodiments, a total number of flip-flop resources (the dedicated flip-flop resources along with the mutable flip-flop resources) is one or more of: sufficient to assign all of the placed flip-flops; and sufficient to assign all of the placed flip-flops with an additional number and/or percentage for margin. If the total number of flip-flop resources is not sufficient for all of the placed flip-flops ("Placed <=Total?" 584), then the global placement and/or quantization was not successful, and, in some embodiments, the flow loops back ("No" 584N) for additional processing. The flow is optionally repeated after changing commands/parameters, such as, for example, by adjusting a die size. In various embodiments, optionally and/or selectively after one or more iterations, the flow terminates with no viable global placement achieved.

If the total number of flip-flop resources is sufficient, then the flow proceeds to creating the additional flip-flop resources (beyond the dedicated flip-flop resources) by mutating a number of mutable cells to change combinational logic resources to sequential resources ("Create Sufficient FFs via Mutation" 586). According to various embodiments, the additional flip-flop resources created via mutation are one or more of: spread throughout the Q-block; concentrated more heavily in regions where there are relatively fewer dedicated flip-flop resources; and concentrated more heavily in regions where there is a larger need for additional flip-flop resources, based at least in part on the approximate locations.

After there are sufficient sequential resources (either all from dedicated flip-flop resources, or from a combination of dedicated flip-flop resources and mutable cells), the flow proceeds to assign the placed flip-flops to the sequential resources ("Assign Placed FFs to Dedicated/Mutated" 588). With the sequential resources assigned, the flow proceeds to assign combinational logic devices of the netlist ("Assign Combinational Logic (w/Morphing)" 590). In some embodiments, as part of assigning the combinational logic devices, devices of the netlist are morphed from one form-level representation of the device's function to another to better use available resources. In some embodiments, a failure to place all of the combinational logic devices is treated similarly to a failure to find sufficient sequential resources for all of the placed flip-flops.

The flow illustrated in FIG. 6 is based on mutable cells having an initial configuration as sequential (as opposed to combinational) resources (for ones of the mutable cells that are usable as sequential resources). Processing begins ("Start" 672), analogous to FIG. 5 ("Start" 572), and proceeds to determine approximate locations ("Global Placement" 674), analogous to FIG. 5 "Global Placement" 574 and to determine an analysis window ("Quantize" 675), analogous to FIG. 5 "Quantize" 575.

Using the sequential resources (from the dedicated flip-flop resources, if any, and from the mutable cells), the flow proceeds to assign the placed flip-flops to the sequential resources ("Assign Placed FFs to Dedicated/Mutated" 676). According to various embodiments, the sequential resources are assigned one or more of: always giving preference to dedicated flip-flop resources; and giving preference solely by location. In some embodiments, there are no dedicated flip-flop resources (and all the sequential resources are mutable cells). After the assigning of the placed flip-flops, zero or more of the mutable cells that are sequential resources are left unassigned.

If the total number of flip-flop resources is not sufficient for all of the placed flip-flops ("Placed <=Total?" 678), then the global placement and/or quantization was not successful, and, in some embodiments, the flow loops back ("No" 678N) for additional processing. The flow is optionally repeated after changing commands/parameters, such as, for example, by adjusting a die size. In various embodiments, optionally and/or selectively after one or more iterations, the flow terminates with no viable global placement achieved.

If the total number of flip-flop resources is sufficient, then the flow proceeds to convert the unassigned mutable cells that are sequential resources by mutating the mutable cells to change sequential resources to combinational logic resources ("Mutate Remaining Mutable FFs" 680).

With the sequential resources assigned and with additional combinational logic resources created from the unassigned mutable cells, the flow proceeds to assign combinational logic devices of the netlist ("Assign Combinational Logic (w/Morphing)" 682). In some embodiments, as part of assigning the combinational logic devices, devices of the netlist are morphed from one form-level representation of the device's function to another to better use available resources. In some embodiments, a failure to place all of the combinational logic devices is treated similarly to a failure to find sufficient sequential resources for all of the placed flip-flops.

In some embodiments of the flows of either FIG. 5 or FIG. 6, placement is improved by iterating the assign placed flip-flops and assign combinational logic elements of the flows (and optionally other elements of the flows). In further embodiments, prior to repeating an assignment element, the respective resources are freed, enabling the assignment element to account for results of previous iterations. For example, repeating the assign placed flip-flops element after the assign combinational logic element enables the placed flip-flop to be re-assigned in a manner that accounts for placement of the combinational logic devices.

In various embodiments, an initial resource allocation is performed. Example initial resource allocations are all mutable resources as combinational resources (such as is assumed for the flow of FIG. 5), and all mutable resources as sequential resources (such as is assumed for the flow of FIG. 6). Placement and quantization are then performed (such as "Global Placement" 574 and "Quantize" 575 of FIG. 5, and "Global Placement" 674 and "Quantize" 675 of FIG. 6). Required resources are then compared to available resources, with optional margining. For example, required sequential resources are compared with dedicated sequential resources together with sequential resources obtainable by mutating mutable combinational resources (similar to "Placed <=Total?" 584 of FIG. 5). For another example, required sequential resources are compared against dedicated sequential resources together with mutable sequential resources (similar to "Placed <=Total?" 678 of FIG. 6). If the required sequential resources are less than the available sequential resources, then processing continues to reallocate resources, otherwise a new placement and/or quantization is performed. If the initial allocation was for all mutable resources to be combinational, then the reallocating changes some of the mutable resources from combinational resources to sequential resources, sufficiently to provide the required sequential resources (similar to "Create Sufficient FFs via Mutation" 586 of FIG. 5). If the initial allocation was for all mutable resources to be sequential, then the reallocating changes some of the mutable resources from sequential resources to combinational resources, such that sufficient sequential resources remain for the required sequential resources (similar to "Mutate Remaining Mutable FFs" 680 of FIG. 6). Processing then completes by assigning the sequential and combination resources, respectively, to placed sequential and combinational elements.

CONCLUSION

Certain choices have been made in the description merely for convenience in preparing the text and drawings and unless there is an indication to the contrary the choices should not be construed per se as conveying additional information regarding structure or operation of the embodiments described. Examples of the choices include: the particular organization or assignment of the designations used for the figure numbering and the particular organization or assignment of the element identifiers (i.e., the callouts or numerical designators) used to identify and reference the features and elements of the embodiments.

The words "includes" or "including" are specifically intended to be construed as abstractions describing logical sets of open-ended scope and are not meant to convey physical containment unless explicitly followed by the word "within."

Although the foregoing embodiments have been described in some detail for purposes of clarity of description and understanding, the invention is not limited to the details provided. There are many embodiments of the invention. The disclosed embodiments are exemplary and not restrictive.

It will be understood that many variations in construction, arrangement, and use are possible consistent with the description and are within the scope of the claims of the issued patent. For example, interconnect and function-unit bit-widths, clock speeds, and the type of technology used are variable according to various embodiments in each component block. The names given to interconnect and logic are merely exemplary, and should not be construed as limiting the concepts described. The order and arrangement of flowchart and flow diagram process, action, and function elements are variable according to various embodiments. Also, unless specifically stated to the contrary, value ranges specified, maximum and minimum values used, or other particular specifications (such as shapes, orientations, and sizes of transistors; functions of particular cells or elements; a manufacturing process or materials used to produce an IC; a number of processing steps and/or photomask used to manufacture an IC; a number of layers of metal or other interconnect used in an IC; and the number of entries or stages in registers and buffers), are merely those of the described embodiments, are expected to track improvements and changes in implementation technology, and should not be construed as limitations.

Functionally equivalent techniques known in the art are employable instead of those described to implement various components, sub-systems, functions, operations, routines, and sub-routines. It is also understood that many functional aspects of embodiments are realizable selectively in either hardware (i.e., generally dedicated circuitry) or software (i.e., via some manner of programmed controller or processor), as a function of embodiment dependent design constraints and technology trends of faster processing (facilitating migration of functions previously in hardware into software) and higher integration density (facilitating migration of functions previously in software into hardware). Specific variations in various embodiments include, but are not limited to: differences in partitioning; different form factors and configurations; use of different operating systems and other system software; use of different interface standards, network protocols, or communication links; and other variations to be expected when implementing the concepts described herein in accordance with the unique engineering and business constraints of a particular application.

The embodiments have been described with detail and environmental context well beyond that required for a minimal implementation of many aspects of the embodiments described. Those of ordinary skill in the art will recognize that some embodiments omit disclosed components or features without altering the basic cooperation among the remaining elements. It is thus understood that much of the details disclosed are not required to implement various aspects of the embodiments described. To the extent that the remaining elements are distinguishable from the prior art, components and features that are omitted are not limiting on the concepts described herein.

All such variations in design comprise insubstantial changes over the teachings conveyed by the described embodiments. It is also understood that the embodiments described herein have broad applicability to other computing and networking applications, and are not limited to the particular application or industry of the described embodiments. The invention is thus to be construed as including all possible modifications and variations encompassed within the scope of the claims of the issued patent.

What is claimed is:

1. A method comprising:
    analyzing, by a computing apparatus, a placement of devices of at least a portion of a netlist of an integrated circuit, wherein the placement is in accordance with a first allocation of resources;
    comparing, by the computing apparatus, a number of non-mutable elements of the resources of the first allocation to a number of mutable elements of the resources of the first allocation;
    adding, by the computing apparatus, at least one additional non-mutable element to the first allocation if the number of mutable elements is greater than the number of non-mutable elements; and
    formulating, by the computing apparatus, a second allocation of the resources by mutating, based at least in part on a result of said analyzing, comparing, and adding, a resource element of a first type to form a resource element of a second type.

2. The method of claim 1, wherein at least one of the first type or the second type is a sequential logic resource.

3. The method of claim 1, wherein at least one of the first type or the second type is a flip-flop resource.

4. The method of claim 1, wherein the first type is a flip-flop resource and the second type is a combination logic resource.

5. The method of claim 1, wherein the first type is a resource having a first drive strength and the second type is a resource having a second drive strength greater than the first drive strength.

6. The method of claim 1, wherein said analyzing comprises analyzing a global placement of the devices.

7. The method of claim 1, wherein said analyzing comprises analyzing a detailed placement of the devices.

8. The method of claim 1, further comprising manufacturing, at least in part, the integrated circuit.

9. A non-transitory computer-readable medium having stored thereon, computer-executable instructions that, in response to execution by a computing apparatus, cause the computing apparatus to perform operations including:
    analyzing a placement of devices of at least a portion of a netlist of an integrated circuit, wherein the placement is in accordance with a first allocation of resources;

comparing, by the computing apparatus, a number of non-mutable elements of the resources of the first allocation to a number of mutable elements of the resources of the first allocation;

adding, by the computing apparatus, at least one additional non-mutable element to the first allocation if the number of mutable elements is greater than the number of non-mutable elements; and formulating a second allocation of the resources by mutating, based at least in part on a result of the analyzing, comparing, and adding, a resource element of a first type to form a resource element of a second type.

10. The computer readable-medium of claim 9, wherein the operations further comprise generating the placement by simultaneous dynamical integration of an analogous system of nodes and forces.

11. The computer readable-medium of claim 10, wherein one or more of the forces are damping, attractive, or spreading forces.

12. A system comprising:

a processor; and a storage medium coupled to the processor by way of a bus, the storage medium having stored thereon, instructions that, in response to execution by the processor, cause the system to:

analyze a placement of devices of at least a portion of a netlist of an integrated circuit, wherein the placement is in accordance with a first allocation of resources;

compare a number of non-mutable elements of the resources of the first allocation to a number of mutable elements of the resources of the first allocation;

add at least one additional non-mutable element to the first allocation if the number of mutable elements is greater than the number of non-mutable elements; and formulate a second allocation of the resources by mutating, based at least in part on a result of said analyze, compare, and add, a resource element of a first type to form a resource element of a second type.

13. The system of claim 12, wherein the non-mutable elements and the mutable elements comprise resource elements of a first type; and wherein said add comprises mutating resource elements of a second type if the number of mutable elements is greater than the number of non-mutable elements.

14. The system of claim 12, wherein said compare is performed before said formulate.

15. The system of claim 12, wherein the devices comprise a first driver, wherein the instructions, in response to execution by the processor, further cause the system to replace the first driver with a second driver, and wherein the first driver and the second driver have different drive strengths.

16. The system of claim 12, wherein the devices comprise at least one driver, and wherein the instructions, in response to execution by the processor, further cause the system to modify a drive strength of the at least one driver.

17. The system of claim 16, wherein the instructions, in response to execution by the processor, further causes the system to mutate one or more of the resources to modify the drive strength of the at least one driver.

18. The system of claim 12, wherein the instructions, in response to execution by the processor, further causes the system to insert a buffer among the devices to modify a timing of the netlist.

* * * * *

UNITED STATES PATENT AND TRADEMARK OFFICE
CERTIFICATE OF CORRECTION

| | | |
|---|---|---|
| PATENT NO. | : 7,840,927 B1 | Page 1 of 1 |
| APPLICATION NO. | : 11/953048 | |
| DATED | : November 23, 2010 | |
| INVENTOR(S) | : Dozier et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 359 days.

Signed and Sealed this
Tenth Day of May, 2011

David J. Kappos
*Director of the United States Patent and Trademark Office*